US007979147B1

(12) United States Patent
Dunn

(10) Patent No.: US 7,979,147 B1
(45) Date of Patent: Jul. 12, 2011

(54) ENGINE SOUND REPLICATION DEVICE

(76) Inventor: James Francis Dunn, San Rafael, CA (US)

( * ) Notice: Subject to any disclaimer, the term of this patent is extended or adjusted under 35 U.S.C. 154(b) by 0 days.

(21) Appl. No.: 12/287,193

(22) Filed: Oct. 6, 2008

(51) Int. Cl.
*G06F 17/00* (2006.01)
*H03G 3/00* (2006.01)
*G10K 11/00* (2006.01)
*G10L 21/00* (2006.01)

(52) U.S. Cl. ............. 700/94; 381/61; 181/192; 704/504

(58) Field of Classification Search .................... 381/61; 181/192, 227, 228; 700/94; 704/504
See application file for complete search history.

(56) References Cited

U.S. PATENT DOCUMENTS 5,820,442 A * 10/1998 Helder ............................ 381/61
6,356,185 B1 * 3/2002 Plugge et al. ................... 381/61
2004/0167761 A1 * 8/2004 Sizov ................................ 703/8
2006/0074645 A1 * 4/2006 Tischer ......................... 704/226

OTHER PUBLICATIONS

BlueOBD, "bluetooth project based on OBD-2 chipset", Aug. 6, 2007 (via web.archive.org), www.blueobd.com, entire document.*

* cited by examiner

*Primary Examiner* — Curtis Kuntz
*Assistant Examiner* — Jesse Elbin
(74) *Attorney, Agent, or Firm* — Risto A. Rinne, Jr.

(57) ABSTRACT

An apparatus for replicating an engine and/or exhaust sound of a predetermined vehicle includes files stored in computer-readable form in a memory library of the engine and/or exhaust sound of the predetermined vehicle. A microcomputer operated controller receives engine data such as the RPM of the engine of the personal vehicle and continually selects which files to obtain and use. The controller adjusts the sound pattern to optimally correspond in a preferred way with the RPM of the engine of the personal vehicle and the controller provides an output signal that is amplified and fed to a speaker for audio playback of a replicated sound of the engine and/or exhaust sound of the predetermined vehicle in the personal vehicle. A speaker disposed outside the vehicle includes a conical or cylindrical shape. A diagnostic capability is also disclosed. Connection to an OBD II connector provides the desired engine data.

29 Claims, 5 Drawing Sheets

ENGINE SOUND REPLICATION DEVICE

BACKGROUND OF THE INVENTION

1. Field of the Invention

The present invention, in general, relates to motor vehicles and, more particularly, to the exhaust sound produced by automobiles or other types of motor vehicles.

Having internal combustion engines, motor vehicles have, since their inception, produced an audible and, at times, distinct exhaust sound. The sound that is produced often varies from automobile to automobile. For example, the exhaust sound from an eight cylinder muscle car, such as an old CHEVROLET CORVETTE, is quite different than the exhaust sound of a modern FERRARI.

The exhaust sound that an automobile produces is important to many people. When the MIATA model was introduced, MAZDA MOTOR COMPANY as the maker of the MIATA, claimed to have tried over 200 different exhaust configurations in an attempt to obtain an optimum sounding exhaust system.

Many people have developed a general preference for how an automobile should ideally sound. For example, some people prefer the sound of twelve cylinder relatively high RPM automobile engines while other prefer the deeper sound of low RPM large displacement engines. In fact, the sound of a particular vintage automobile may have become associated with a period in a person's life and, upon again hearing that sound, it may trigger fond memories and thereby, even cause an uplifting of spirit. That person may indeed long for an automobile that produces the particular exhaust sound of some vintage, classic, or unusual automobile.

However, that is difficult to achieve. Vintage, classic, or exotic automobiles are in limited supply and are far too expensive for most people. With today's available automobiles, many of the models have similar identical power plants (i.e., engines). Accordingly, there may be little difference in the sound among the many models that are available. Even among the various models there may not be an appreciable difference in the sound from one manufacturer to another.

As a result people spend a good deal of money purchasing after-market exhaust systems in order to endow their particular car, truck, or motorcycle with a unique sound that they hope will be pleasing to their ears and also pleasing to the ears of others.

The problem is that they cannot know ahead of time what the after-market exhaust system will sound like on their particular motor vehicle until after they have purchased it and installed it. Then, if they do not like the sound it produces they are basically bound to endure it or replace it with yet another after-market exhaust system. If the first exhaust system is replaced, then its entire cost is typically absorbed by the end-user; not a pleasant situation.

The maximum legal volume permitted for a motor vehicle's exhaust sound (i.e., pressure) is generally regulated for all vehicles that are used on public roads and highways. Regulations may be set by local governments, the state, or the Federal government. These regulations limit the sound pressure (i.e., volume) that most vehicles can produce.

Many after-market exhaust systems are louder than stock exhaust systems and some after-market exhaust systems may, at times, exceed permissible maximum volume levels (typically measured in decibels). As used herein, the term "after-market" is broad and includes any exhaust system component that may replace or be added as an additional component to an existing (i.e., stock) exhaust system.

Many people prefer a more robust sound to their exhaust and may be inclined to put a louder after-market exhaust system on an automobile that is used on public roads. Doing so places them at risk for citation and fine.

For all exhaust systems, stock or after-market, the sound volume of the exhaust is not in any practical way, adjustable. This is because the volume that an exhaust system produces is not a user-controllable variable, other than how it relates to RPM and load.

For virtually all automobiles, the volume (sound pressure) varies with the speed of the engine and the load upon the engine. For any given engine, the exhaust volume typically rises with an increase in engine speed (RPM) and lowers with a lessening of engine speed. The exhaust volume also typically rises with an increase in load upon the engine. For example, most automobile engines will produce a louder exhaust sound when the engine reaches high RPM during acceleration than it would at the same high RPM but under no load, such as when the vehicle is in neutral.

Whether the vehicle is accelerating or decelerating also matters. Many vehicles produce an entirely different sound depending upon whether the vehicle is accelerating or decelerating. Some vehicles may even backfire and produce a louder sound (i.e., greater sound pressure) when decelerating rather than accelerating.

With conventional exhaust systems it is not possible to effectively control the volume of exhaust by a control of load and engine speed because normal driving conditions vary and impose various loads upon an engine during use. In other words, if a person had an exhaust system that, at times, was too loud (i.e., not "street-legal"), the person could not merely drive at idle or very low engine speeds when on public roads to lessen the volume of exhaust sound. At times, the driver would have to accelerate in order to reach a safe driving speed comparable to that of other vehicles, thereby raising the exhaust volume beyond an acceptable level.

Yet, a long-standing need to vary the volume of exhaust (i.e., engine sound) does exist. A person driving on a busy city street would not want their exhaust sound to be excessively loud, less they attract undo attention and possibly receive a citation. However, when the same person was pleasure-driving the same motor vehicle on a remote rural road he or she might prefer a louder exhaust sound. With both stock and after-market exhaust systems, this has, heretobefore, been impossible to attain.

The exhaust sound is also useful in alerting pedestrians of the approach of a motor vehicle. As such, there is benefit in being able to audibly detect an approaching automobile. For example certain of the newer electric or hybrid automobiles, when running only on electricity, are very nearly silent in operation.

This has caused problems because people, unaware of their approach, have entered into the path of an approaching and especially quiet automobile. This is a problem for normally sighted people and can be especially serious for the visually impaired. As a result, a motor vehicle that is too quiet is, at times, dangerous and this realization has prompted the consideration of legislation intended to require that motor vehicles produce some sort of an audible sound.

There has, heretobefore, been no aesthetically acceptable way of producing an acceptable sound, such as an exhaust sound, for motor vehicles that is both pleasing to the ear and of appropriate volume so as to be useful in warning pedestrians of the approaching vehicle at a safe distance.

Also, there is the problem of acclimation and boredom. People get used to the way their automobile sounds and, consequently, their ability to enjoy the sound of their vehicle diminishes with time. This is the result of becoming acclimated to the vehicle's sound and the result is a loss of awareness. Drivers may genuinely enjoy the way their vehicle sounds and over the course of time the same sound that at one time delighted their senses may become boring and even monotonous. Ideally, a driver would want to vary the character of exhaust so that it replicates the exhaust sound produces by different vehicles from time to time.

The ability to instantaneously change the character of exhaust sound and its volume have not been satisfied by any of the prior art solutions.

Sometimes, the driver may want to alter the sound that is heard primarily in the cockpit (i.e., in the interior) of the automobile and not that which is heard by others, for example, by pedestrians as the vehicle passes by. At other times, the driver may want to alter the sound that is produced by the vehicle and which others hear. Still, at other times the driver may want a combination of the two whereby the sound that is produced in the vehicle's interior is varied at the same time that the exterior sound that is produced externally is also varied.

This is because the exhaust sound that a driver typically hears is a combination of sounds. It includes sounds that are coming directly from the engine compartment as well as sounds that are coming from the exhaust. Depending on the type of vehicle the balance of these sounds can vary. For example, with roadsters and convertibles a larger percentage of the sound that is heard by the driver will typically emanate from the exhaust while for certain sedans it may include more of the engine sounds coming from the engine compartment.

It is desirable to allow driver's to enjoy whatever sound combination they prefer and to be able to direct that sound primarily in the interior of the vehicle or externally or both.

The characteristic sound of an automobile is a variable, as was previously mentioned, because it varies with engine speed and with load. Therefore, it has not been possible to effectively replicate the exhaust sounds of different motor vehicles for use in a dynamic environment.

In other words, if a particular vintage automobile's exhaust sound was recorded and played through an automobile's stereo system, this would not be pleasing to a user of such a system because the sound that is being heard would not correlate to what the automobile is doing. A driver would not appreciate listening to the vintage car accelerate while they were idling at a stop light, nor would they appreciate the sound of the vintage car at idle while they were accelerating.

To be realistic, the sound that is produced must be synchronized with the engine speed of the vehicle in which it is heard.

Additionally, it would be even more realistic if it were synchronized and adjusted accordingly with the load of the motor vehicle in which it is overlaid.

For example, if a driver is listening to the recorded sound produced by a vintage automobile while driving a personal vehicle, the vintage vehicle's sound must match the engine speed of the personal vehicle. If the personal vehicle is decelerating, it is desirable that the sound the driver hears reflect that of the vintage vehicle when the vintage vehicle is decelerating. Conversely, if the personal vehicle is accelerating, it is desirable that the sound the driver hears reflect that of the vintage vehicle when the vintage vehicle is accelerating.

It is desirable at times to have the exhaust volume that is externally audible (i.e., to pedestrians) quiet while the exhaust sound that a driver hears in the cockpit (i.e., interior) is loud. The driver may want to enjoy listening to a loud replicated engine sound that only they hear without disturbing those who are external to the vehicle. This has, heretobefore, been impossible to attain.

The need to make an automobile sound different is not confined to making it sound only like other automobiles. For example, a pilot might want to make his personal vehicle (car) sound like a P51 Mustang or some other type of current or vintage airplane. Similarly, a boating enthusiast might want to make his personal vehicle sound like a vintage boat, for example, an old Chris Craft. Continuing the need, a motorcycle enthusiast might want his personal vehicle to sound like a Harley-Davidson or some other vintage motorcycle.

It is also important to note that the exhaust system and its output may be regulated, as previously mentioned, by local, state, or Federal laws, whereas an audio output may not be regulated or it may not be regulated in the same manner. While it may be prohibited to modify the exhaust system for certain types of vehicles or it may be prohibited to make modification to the exhaust system that increases the volume of the exhaust noise produced it may be permissible to include an audio output of any preferred volume that replicates exhaust sound and thereby accomplishes the desired effect without infraction of any laws.

All of the prior art solutions to this date have failed to adequately satisfy various important requirements as described above and below and, as a result, a desirable solution is not yet commercially available.

As an example of various additional needs that have not been satisfied, there is a need for both rapid and uncomplicated installation. Ideally, the device would require it being plugged into a single connector in the vehicle and be ready for use.

If communication between the device and a stereo system in the vehicle were wireless, then the need to run electrical cables and pay for complicated or expensive electrical wiring would be eliminated.

Ideally, such a device could be installed directly by the user, or alternately, by those with minimum technical expertise.

Additionally, there is a need to use existing technology devices as platforms. This can reduce the cost of such a device when the user already has such a platform available. For example, the IPHONE™ is a popular device that could be used as a platform. Similarly, the IPOD TOUCH™ is another popular device that could be used as a platform.

Accordingly, there exists today a need for an engine sound replication device that helps to ameliorate the above-mentioned problems and difficulties as well as ameliorate those additional problems and difficulties as may be recited in the "OBJECTS AND SUMMARY OF THE INVENTION" or discussed elsewhere in the specification, or which may otherwise exist or occur and are not specifically mentioned herein.

Clearly, such an apparatus would be a useful and desirable device.

2. Description of Prior Art

Exhaust systems of all types are, in general, known. Engine monitoring equipment is also, generally, known. For example, the following patents describe certain types of engine monitoring devices:

U.S. Pat. No. 6,973,377 to Majstorovic et al., that issued on Dec. 6, 2005;

U.S. Pat. No. 7,013,207 to Majstorovic et al., that issued on Mar. 14, 2006; and The entire specification of U.S. Pat. No. 6,973,377 is hereby incorporated by way of reference herein as a part of this specification.

The entire specification of U.S. Pat. No. 7,013,207 is hereby incorporated by way of reference herein as a part of this specification.

These prior art references teach devices and methods of obtaining acceleration and RPM data from an engine that is useful with the present invention.

Additionally, U.S. Pat. No. 5,835,605 to Kunimoto that issued on Nov. 10, 1998 teaches an exhaust sound synthesizer that is used with flight simulators and computer games but which differs from the instant invention in material ways. For example, it does not include a memory library of engine sounds from a variety of predetermined vehicles but instead includes one basic exhaust waveform that is taken at different periods and which is selected depending on speed information supplied by a joystick or acceleration pedal of the game. The selected waveform is then subjected to an exhaust pipe circuit that appears to introduce delays and reverberation into the waveform and thereby synthesize an output that sounds like exhaust operating through one particular muffler (i.e., tailpipe). In short, it is a synthesizer and not a replication device of engine sounds and thereby teaches away from replication.

Additionally, US Patent Application Number 20050259830 is for a sound enhancement for a single engine sensor and thereby does not include the memory library and other elements of the instant invention as mentioned in the previous comparison with the known prior art.

Other related prior art patents and publications include:

U.S. Pat. No. 6,356,185 to Plugge et al., Mar. 12, 2002;

U.S. Pat. No. 5,820,442 to Helder, Oct. 13, 1998;

U.S. Pat. No. 5,237,617 to Miller, Aug. 17, 1993;

U.S. Pat. No. 7,203,321 to Freymann et al., Apr. 10, 2007;

U.S. Pat. No. 7,088,829 to Schick et al, Aug. 8, 2006;

U.S. Pat. No. 6,959,094 to Cascone et al, Oct. 25, 2005;

U.S. Pat. No. 6,859,539 to Maeda, Feb. 22, 2005;

U.S. Pat. No. 6,725,150 to Glandian, Apr. 20, 2004;

U.S. Pat. No. 6,275,590 to Prus, Aug. 14, 2001;

U.S. Pat. No. 5,734,726 to Truchsess, 1998;

U.S. Pat. No. 5,692,052 to Tanaka et al, Nov. 25, 1997;

U.S. Pat. No. 5,635,903 to Koike et al, Jun. 3, 1997;

U.S. Pat. No. 5,371,802 to McDonald et al, Dec. 6, 1994;

Patent publication US 2005/0259830 to Vaishya, Nov. 24, 2005;

Patent publication US 2007/0147626 to Casey et al., Jun. 28, 2007;

While the structural arrangements of the above described device may, at first appearance, have certain distant similarities with the present invention, it differs in material respects. These differences, which will be described in more detail hereinafter, are essential for the effective use of the invention and which admit of the advantages that are not available with any of the known prior art devices.

OBJECTS AND SUMMARY OF THE INVENTION

It is an object of the present invention to provide an engine sound replication device that is inexpensive to manufacture.

It is also an important object of the invention to provide an engine sound replication device that can replicate the exhaust sound of a predetermined vehicle.

Another object of the invention is to provide an engine sound replication device that can replicate the engine and/or exhaust sound of a predetermined vehicle.

Still another object of the invention is to provide an engine sound replication device that permits a user to select a sound from a library that includes a variety of recorded or digitally encoded predetermined different vehicle sounds.

Still yet another object of the invention is to provide an engine sound replication device that permits a user to vary the volume of sound that is produced.

Yet another important object of the invention is to provide an engine sound replication device that permits a user to replicate a desired automobile exhaust or engine sound in an interior of a personal automobile.

Still yet another important object of the invention is to provide an engine sound replication device that permits a user to replicate a desired automobile exhaust or engine sound in an exterior of a personal automobile.

A first continuing object of the invention is to provide an engine sound replication device that permits a user to replicate a desired automobile exhaust or engine sound in both an interior and an exterior of a personal automobile simultaneously.

A second continuing object of the invention is to provide an engine sound replication device that includes synchronization with the sound that is produced by the device so that it matches the current engine speed and/or operating characteristics of a personal vehicle in which it is used.

A third continuing object of the invention is to provide an engine sound replication device that includes synchronization with the sound that is produced by the device so that it matches the acceleration or deceleration of a personal vehicle in which it is used.

A fourth continuing object of the invention is to provide an engine sound replication device that can make a four cylinder personal vehicle sound like a six, eight, or twelve cylinder predetermined vehicle.

A fifth continuing object of the invention is to provide an engine sound replication device that can produce a simulated exhaust or engine sound of a predetermined vehicle that is realistic.

A sixth continuing object of the invention is to provide an engine sound replication device that can be adjusted to produce a simulated or replicated exhaust sound that is loud and which may exceed a maximum permissible sound pressure (volume level) for street use when the vehicle is used off road or in remote areas where such restrictions do not apply.

A seventh continuing object of the invention is to provide an engine sound replication device that includes in memory at least one recording of an engine or engine exhaust sound produced by a predetermined vehicle, a computer that is able to access the memory, means for determining the engine RPM of a personal vehicle in which the device is to be used, software adapted to produce an output signal by modifying the recording of an engine or engine exhaust sound, and wherein the output signal can be used to drive a speaker, either directly or by passing the output signal to an amplifier or a stereo system prior to connection to the speaker, the output signal being further controlled by the computer so as to correspond with the engine speed of the personal vehicle.

An eighth continuing object of the invention is to provide an engine sound replication device that includes in memory at least one recording of an engine or engine exhaust sound produced by a predetermined vehicle, a computer that is able to access the memory, means for determining the engine RPM of a personal vehicle in which the device is to be used, software adapted to produce an output signal by modifying the recording of an engine or engine exhaust sound, and wherein the output signal can be used to drive a speaker, either directly or by passing the output signal to an amplifier or a stereo system prior to connection to the speaker, the output signal being further controlled by the computer so as to correspond with the engine speed of the personal vehicle, and which further includes means for selecting from memory the recording of an engine or engine exhaust sound from a plurality of recordings of engine or exhaust sounds produced by a plurality of different types of predetermined vehicles.

A ninth continuing object of the invention is to provide an engine sound replication device that includes in memory at least one recording of an engine or engine exhaust sound produced by a predetermined vehicle, a computer that is able to access the memory, means for determining the engine RPM of a personal vehicle in which the device is to be used, software adapted to produce an output signal by modifying the recording of an engine or engine exhaust sound, and wherein the output signal can be used to drive a speaker, either directly or by passing the output signal to an amplifier or a stereo system prior to connection to the speaker, the output signal being further controlled by the computer so as to correspond with the engine speed of the personal vehicle, and which further includes means for adjusting the volume of sound produced by the speaker.

A tenth continuing object of the invention is to provide an engine sound replication device that includes in memory at least one recording of an engine or engine exhaust sound produced by a predetermined vehicle, a computer that is able to access the memory, means for determining the engine RPM of a personal vehicle in which the device is to be used, software adapted to produce an output signal by modifying the recording of an engine or engine exhaust sound, and wherein the output signal can be used to drive a speaker, either directly or by passing the output signal to an amplifier or a stereo system prior to connection to the speaker, the output signal being further controlled by the computer so as to correspond with the engine speed of the personal vehicle, and wherein the speaker is disposed in an interior of the personal vehicle.

An eleventh continuing object of the invention is to provide an engine sound replication device that includes in memory at least one recording of an engine or engine exhaust sound produced by a predetermined vehicle, a computer that is able to access the memory, means for determining the engine RPM of a personal vehicle in which the device is to be used, software adapted to produce an output signal by modifying the recording of an engine or engine exhaust sound, and wherein the output signal can be used to drive a speaker, either directly or by passing the output signal to an amplifier or a stereo system prior to connection to the speaker, the output signal being further controlled by the computer so as to correspond with the engine speed of the personal vehicle, and wherein the speaker is disposed in an exterior of the personal vehicle.

A twelfth continuing object of the invention is to provide an engine sound replication device that includes in memory at least one recording of an engine or engine exhaust sound produced by a predetermined vehicle, a computer that is able to access the memory, means for determining the engine RPM of a personal vehicle in which the device is to be used, software adapted to produce an output signal by modifying the recording of an engine or engine exhaust sound, and wherein the output signal can be used to drive a speaker, either directly or by passing the output signal to an amplifier or a stereo system prior to connection to the speaker, the output signal being further controlled by the computer so as to correspond with the engine speed of the personal vehicle, and wherein the speaker is disposed in an interior of the personal vehicle and including a second speaker, and wherein the second speaker is disposed in an exterior of the personal vehicle, and including means for directing the output signal to either the speaker or to the second speaker, or to both the speaker and the second speaker simultaneously.

A thirteenth continuing object of the invention is to provide an engine sound replication device that plugs into a power outlet in a motor vehicle and obtains power from the power outlet.

A fourteenth continuing object of the invention is to provide an engine sound replication device that plugs into a power outlet in a motor vehicle and which is able to obtain a signal that is representative of the real-time RPM of the engine of the motor vehicle from the power outlet.

A fifteenth continuing object of the invention is to provide an engine sound replication device that is able to transmit a simulated (i.e., replicated) automobile sound to the stereo system in a personal vehicle.

A sixteenth continuing object of the invention is to provide an engine sound replication device that is able to transmit a simulated (i.e., replicated) automobile sound to speakers that are disposed in an exterior or other location of a personal vehicle.

A seventeenth continuing object of the invention is to provide an engine sound replication device that is able to obtain engine data from an on-board computer of a personal vehicle by electrical connection thereto, such as by connection to an OBD II type of under dashboard connector, and wherein the device is able to utilize the data thus obtained to optimize the replication of an engine or engine exhaust sound of a predetermined automobile.

An eighteenth continuing object of the invention is to provide an engine sound replication device that is able to obtain engine data from an on-board computer of a personal vehicle by electrical connection thereto, such as by connection to an OBD II type of under dashboard connector, and wherein the device is able to utilize the data thus obtained to determine when the personal vehicle is accelerating, decelerating, idling, moving, standing still, under heavy or light load, moving at a steady rate of speed, or changing gears and wherein the device is able to utilize the data thus obtained to better replicate a sound of a predetermined automobile.

A nineteenth continuing object of the invention is to provide an engine sound replication device that includes at least one speaker that is disposed in an exterior of an automobile and wherein the speaker includes a shape that resembles the shape of at least a portion of an automobile tailpipe.

A twentieth continuing object of the invention is to provide an engine sound replication device that is able to vary the audible sound produced by an automobile without any modification to the stock (i.e., original) exhaust system of the vehicle.

A twenty-first continuing object of the invention is to provide an engine sound replication device that can replicate the exhaust sound of a predetermined engine and output the replicated sound as audio in a personal vehicle.

A twenty-second continuing object of the invention to provide an engine sound replication device that can replicate the engine or exhaust sound of a predetermined airplane and output the replicated sound as audio in a personal vehicle.

A twenty-third continuing object of the invention to provide an engine sound replication device that can replicate the engine or exhaust sound of a predetermined automobile and output the replicated sound as audio in a personal vehicle.

A twenty-fourth continuing object of the invention to provide an engine sound replication device that can replicate the engine or exhaust sound of a predetermined boat and output the replicated sound as audio in a personal vehicle.

A twenty-fifth continuing object of the invention to provide an engine sound replication device that can replicate the engine or exhaust sound of a predetermined motorcycle and output the replicated sound as audio in a personal vehicle.

A twenty-sixth continuing object of the invention to provide an engine sound replication device that can replicate the engine or exhaust sound of a predetermined truck and output the replicated sound as audio in a personal vehicle.

A twenty-seventh continuing object of the invention to provide an engine sound replication device that can replicate any of the sounds or noises produced by an engine and output the replicated sounds or noises as audio in a personal vehicle.

A twenty-eighth continuing object of the invention to provide an engine sound replication device that can replicate the sounds or noises produced by the transmission of an engine and output the replicated sounds or noises as audio in a personal vehicle.

A twenty-ninth continuing object of the invention to provide an engine sound replication device that can replicate the sounds or noises produced by any of the moving parts of an engine, transmission, or drive train and output the replicated sounds or noises as audio in a personal vehicle.

A thirtieth continuing object of the invention to provide an engine sound replication device that can replicate the sounds or noises produced by the transmission of an engine when a gear shift change occurs and output the replicated sounds or noises as audio in a personal vehicle.

A thirty-first continuing object of the invention to provide an engine sound replication device that is able to replicate engine and/or exhaust sounds of a predetermined vehicle in a personal vehicle through an audio system and thereby legally avoid the restrictions as may be imposed by all laws and regulations appertaining to exhaust systems, including mufflers, of automobiles.

A thirty-second continuing object of the invention to provide an engine sound replication device that is able to obtain engine data from an on-board computer of a personal vehicle by electrical connection thereto, such as by connection of an OBD II transmitter to an OBD II type of under dashboard connector, and wherein the OBD II transmitter is able to obtain and transmit the desired information to a stereo receiver, amplifier, or other device capable of receiving it using any preferred transmission technology including BLUETOOTH™, RF, IR, or any other preferred method or protocol.

A thirty-third continuing object of the invention to provide an engine sound replication device that includes an accelerometer that is able to detect acceleration or deceleration of a vehicle in which the device is installed.

A thirty-fourth continuing object of the invention to provide an engine sound replication device that is able to obtain engine data from an on-board computer of a personal vehicle by electrical connection thereto, such as by connection of an OBD II transmitter to an OBD II type of under dashboard connector, and wherein the OBD II transmitter is able to obtain and transmit the desired information to a diagnostic tool as audio, and wherein the audio information could be used to assist diagnosis and repair of the vehicle.

Briefly, an engine sound replication device that is constructed in accordance with the principles of the present invention has a library in some form of computer-readable memory that includes the engine sound or the exhaust sound of at least one predetermined engine therein. The predetermined engine sound can be that of any preferred automobile, truck, motorcycle, airplane, boat, racecar, go kart, or other motor vehicle. The exhaust or engine sound preferably includes a sampling of the predetermined automobile's (or other type of vehicle's) engine at idle, during steady-state operation at a predetermined speed, during acceleration, and during deceleration. According to a preferred embodiment, the exhaust sound is preferred and other computer-readable engine or related sounds may also be available in the library for access and use, such as the sound produced by movement of the internal and external component parts of the predetermined engine or by any of the component parts that are driven by the predetermined engine, including gear changes of the transmission, and drive train noises (such as the sound of moving drive shafts, universal joints, and the like). According to a preferred embodiment the library includes a plurality of recorded predetermined engine sounds in computer-readable form, and example thereof being the use of MIDI files. A controller includes a computer and receives real time input regarding the engine speed of the predetermined engine of a personal vehicle in which the engine sound replication device is to be used. The controller determines if the personal vehicle is at idle, driving at a steady speed, accelerating, or decelerating. If gear change information is available the controller determines that as well. The controller determines which of the plurality of recorded predetermined engine sounds is to be replicated by user input selection. The controller then obtains and utilizes appropriate sampling patterns of engine and/or exhaust sounds from the library that corresponds as close as possible with the engine RPM and operating characteristics (i.e., accelerating, decelerating, or gear changes) of the personal vehicle. An output signal is produced by the controller that includes a waveform of an exhaust or engine sound that is suitable to drive a speaker or amplifier. The speaker may be located in an interior of the automobile or at a preferred location out of the interior of the automobile (i.e., at an exterior location), or both. The volume is preferably adjustable. The driver (user) is able to select which particular engine and/or exhaust sound pattern is to be replicated. The sound output of the engine sound replication device overlays the ambient sounds that the personal vehicle produces or experiences. By adjusting the volume of the engine sound replication device a preferred listening level is obtained. A sufficient increase in volume provides an overall combined sound that can be made to appear as if it is primarily that of the predetermined engine or engine exhaust. In this manner, the personal vehicle is made to sound like (i.e., to replicate) the sound of any preferred predetermined type of vehicle. Various novel ways of deriving real-time engine data of the personal vehicle as well as additional details and optional capabilities of the device are also disclosed including the use of BLUETOOTH™ and FM transmission to simplify installation and connection to an OBD II type of under dashboard connector to obtain desired engine data of the personal vehicle. Connection of an OBD II transmitter to an OBD II under dashboard connector is also disclosed wherein the OBD II transmitter transmits via BLUETOOTH™ protocol the desired engine data to a receiver that can include certain new on board stereo receivers or other devices that can function as a platform, such as an IPHONE™ or an IPOD TOUCH™, and wherein the IPHONE™ or the IPOD TOUCH™ can produce the desired engine replication sound that is synchronized to the operating condition of the engine of the personal vehicle and transmit the desired engine replication sound via FM to a stereo receiver of the personal vehicle for playback.

DETAILED DESCRIPTION OF THE INVENTION

Figure 1:
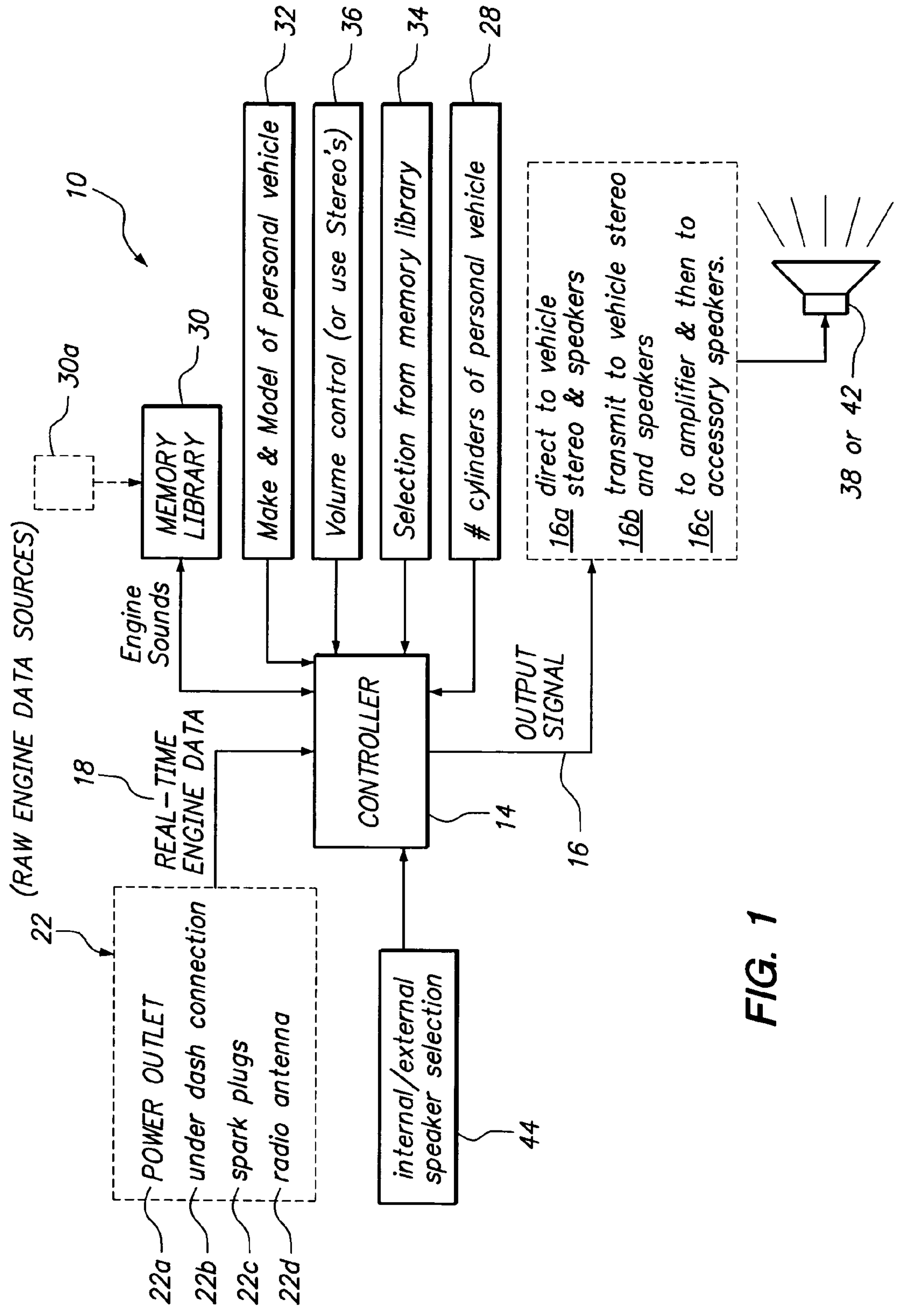
FIG. 1 is a block diagrammatic view of an engine sound replication device.
Figure 2:
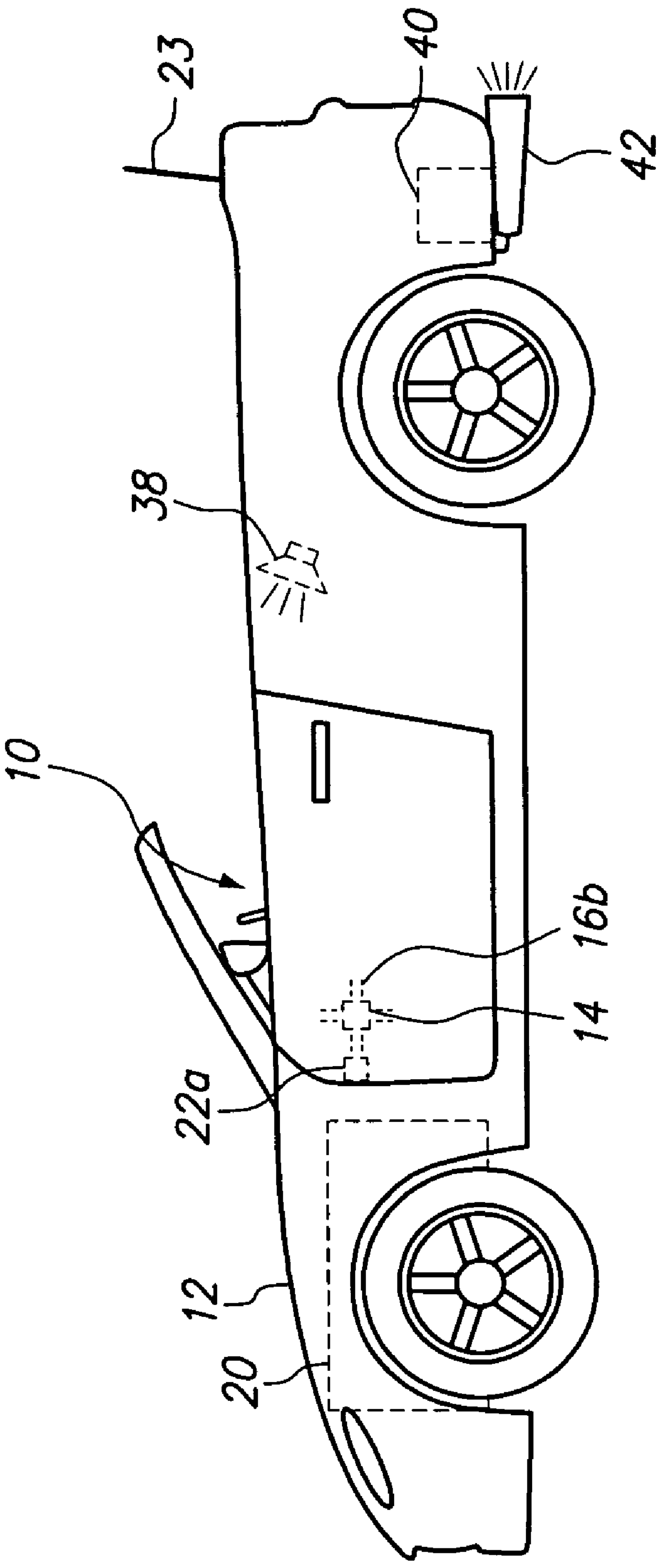
FIG. 2 is a side view of a personal vehicle with the engine sound replication device of FIG. 1 attached thereto.

Referring to FIG. 1 and on occasion to FIG. 2 is shown, an engine sound replication device, identified in general by the reference numeral 10.

The engine sound replication device 10 is intended for use in a personal vehicle 12, automobile, or any other preferred type of a motor vehicle.

As used herein the element "personal vehicle" is not limited to only cars. The use of the term "vehicle" is intended to include any type of a motor vehicle, such as a car, truck, motorcycle, or other type of the personal vehicle 12. The engine sound replication device 10 is used to change the ambient sound of the personal vehicle 12 and to make it sound as if it were a different type of vehicle or powered by a different type of engine and/or transmission. This is described in greater detail, hereinafter.

The engine sound replication device 10 includes a controller 14. The controller 14 includes a microcomputer, RAM, ROM, software, firmware, and circuitry as is well known in the computer arts. The controller 14 is configured with circuitry and software, as necessary, to receive input data (as is identified and described in greater detail hereinafter), utilize the input data, and to produce an output signal 16. The output signal 16 is also described in greater detail hereinafter as is the input data that is received by the controller 14.

It is necessary to supply real time engine data 18 as the required input data to the controller 14. The real time engine data 18 supplies information as to the state of an engine 20 (dashed lines) of the personal vehicle 12. At a minimum the speed that the engine 20 is turning (RPM) is required for the controller 14 to properly function. The reason for supplying the controller 14 with RPM engine data from the personal vehicle 12 is described in greater detail hereinafter.

The real time engine data 18 is obtained from any of a variety of preferred sources of raw engine data, as shown in general by reference numeral 22 (dashed lines). The source of raw engine data 22 can vary depending on which type of a vehicle is used for the personal vehicle 12 and also depending on which of the various sources of engine data 22 is preferred for any given configuration (i.e., model) of the engine sound replication device 10.

The raw engine data 22 includes, at a minimum, information useful to determine the speed (RPM) of the engine 20. The raw engine data 22 can include a digital or analog indication of actual speed (RPM) of the engine 20, such as from a tachometer, or it can include data that relates to the speed of the engine 20 and by analysis thereof can provide indication of the speed of the engine 20. The raw engine data 22 (hereinafter referred to as "engine data 22") can also include other information, such as the speed of the personal vehicle 12, the gear its transmission is in, when a gear change is occurring, or any other type of information that is indicative of the condition under which the personal vehicle 12 is being operated.

A preferred source of engine data 22 is obtained from the 12 VDC power outlet **22*a*, also known as a cigarette lighter outlet in older types of vehicles. The 12 VDC power outlet 22*a* is found in an interior of most types of the personal vehicle 12**.

Figure 3:
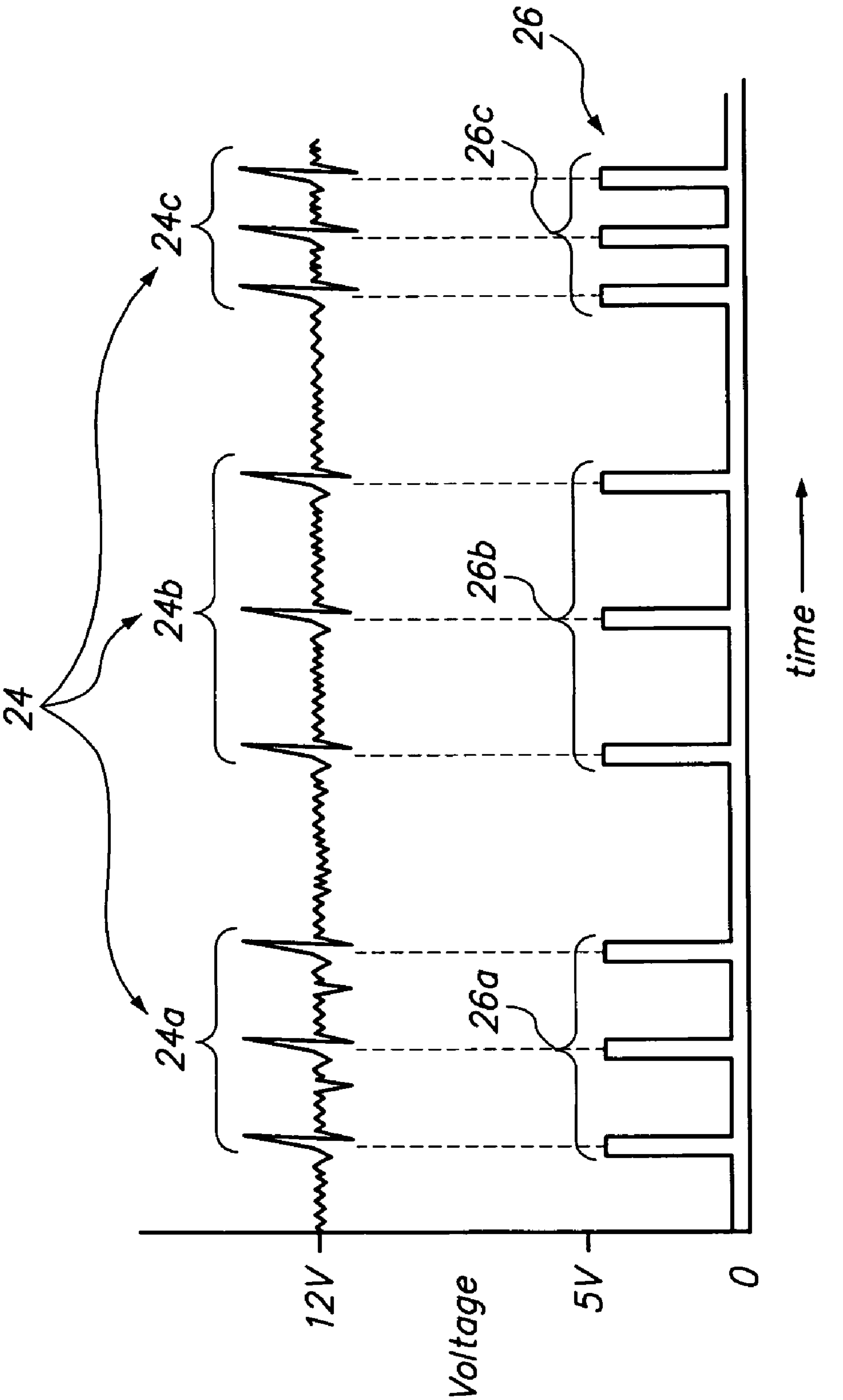
FIG. 3 is a waveform of the 12 volt electrical bus (plus 12 VDC) of the personal vehicle of FIG. 2 when the engine is running and also the waveform of an intermediate pulse representation signal.

The controller 14, according to a preferred embodiment, plugs into the 12 VDC power outlet **22*a* and obtains the necessary electrical power for operation of the engine sound replication device 10 therefrom. Referring now also to FIG. 3 and also to the teachings of Majstorovic et al., in U.S. Pat. Nos. 6,973,377 and 7,013,207, it is noted that an electrical signal in the form of periodic electrical noise is modulated onto the 12 VDC bus and therefore, the periodic electrical noise is also present on the 12 VDC power outlet 22*a***.

The periodic electrical noise appears as electrical spikes, as shown in general by the reference numeral 24, on the 12 VDC power outlet **22*a* that occur whenever any of the spark plugs fire (not shown) in the personal vehicle 12. The rate of the spark plug firing is proportional to the speed (RPM) of the engine 20**.

The periodic electrical noise occurs because of electrical induction and the sudden discharge of stored electrical energy across the gap of each spark plug. This sudden discharge is preceded by a surge in voltage across the spark plug gap and a portion of this energy radiates outward. By subsequent induction and also to some degree by capacitance and back EMF, it appears as periodic electrical spikes 24 throughout the 12 VDC electrical bus and elsewhere in the personal vehicle 12.

The controller 14 includes circuitry and software, as desired, to strip (i.e., demodulate) the periodic electrical noise (i.e., the spikes 24) and to produce an intermediate pulse representation signal, identified in general by the reference numeral 26, in the form of an electrical waveform (i.e., a pulse pattern) that corresponds to when the spark plugs of the personal vehicle 12 fire. Circuitry and software in the controller 14 demodulate the periodic electrical spikes 24 and convert them into the intermediate pulse representation signal 26 that the microcomputer of the controller 14 can use by the use of band-pass filters and demodulation circuitry, as is well known in the electrical arts.

The electrical waveform, as shown, is a simplification of that which can be observed. Additional filter circuitry along with sufficient computer processing (by the microcomputer of the controller 14) are included, as required, to ensure that the periodic electrical spikes 24 are detected and are properly converted into the intermediate pulse representation signal 26.

A first burst **24*a* of the periodic electrical spikes 24 includes a first time interval between each spike 24. A second burst 24*b* of the periodic electrical spikes 24 includes a second time interval between each spike 24. The second time interval is greater than the first time interval. A third burst 24*c* of the periodic electrical spikes 24 includes a third time interval between each spike 24**. The third time interval is less than the first time interval.

The first burst **24*a*, second burst 24*b*, and third burst 24*c* are each converted into a respective first intermediate pulse representation signal 26*a*, second intermediate pulse representation signal 26*b*, and third intermediate pulse representation signal 26*c*, respectively. The microcomputer includes a precise internal clock and is therefore able to accurately determine an actual time interval between any of the intermediate pulse representation signals 26**.

It can be determined from these three waveform patterns that the engine 20 is turning at the slowest rate (in RPM) for the time duration of the second burst **24*b* and that it is turning at the fastest rate for the time duration of the third burst 24***c*, however the exact rate of revolutions of the engine 20 (i.e., the RPM) cannot be determined by the microcomputer without additional information supplied to the controller 14.

The additional information that is required is the number of cylinders of the engine 20 of the personal vehicle 12. A cylinder input switch 28 is set to indicate the number of cylinders of the engine 20 in the personal vehicle 12. Four, six, and eight are the more common number of cylinders. However, some vehicles may have as little as one, two, or three cylinders or as many as twelve.

As desired, any input that is user-selectable and which is supplied to the controller 14 may include a physical switch to accomplish the selection process or the input parameter may be entered or set by any other preferred manner, for example, by a menu selection off of a touch-sensitive or other type of a display. The display can be included as an option with the engine sound replication device 10, as desired. It is to be understood that various models of the engine sound replication device 10 are anticipated with a corresponding variation in pricing and features.

Once the controller 14 is supplied with the number of cylinders of the engine 20 it can convert the varying intermediate pulse representation signals 26 into RPM data for the engine 20. This is because the number of spark plug firings per revolution (or firings per set of revolutions) of the engine 20 corresponds with the number of cylinders that the engine 20 has.

The most common type of engine 20 used in the personal vehicle 12 is of the four-stroke variety. The RPM of the engine 20 is calculated by the controller 14 with the default being for a four-stroke type of the engine 20. If the engine sound replication device 10 is to be used with a two-stroke type of engine (not shown), then the type of internal combustion engine that is used can be optionally included as another user-selectable input for a particular version of the engine sound replication device 10.

It is to be noted that, when the engine sound replication device 10 is in operation, the controller 14 is constantly determining RPM and changes in RPM. Increasing RPM is associated with acceleration of the personal vehicle 12 and decreasing RPM is associated with deceleration of the personal vehicle 12.

A first alternate source of the engine data 18 for the controller 14 is supplied by connection to an under dashboard connector 22*b*. The under dashboard connector 22*b* is included with most new model vehicles and it includes connection to an on-board computer for the personal vehicle 12.

A common type of the under dashboard connector 22*b* is known as an "on board diagnostic" or "OBD". A current standard includes a protocol known as "OBD II" and it is required for placement on light trucks and cars within one meter of the steering wheel. While some of the connections and therefore data in the OBD II are defined, automobile manufacturers have a certain degree of latitude in the data and configuration of the OBD II connectors for their model vehicles. Information regarding this standard can be found on the Internet.

If a source of power (i.e., 12 VDC) is available from the OBD II connector, it is preferably used to supply power to the engine sound replication device 10.

A corresponding electrical connector or adapter having any desired shape and pin-configuration is provided, as desired, for use with the engine sound replication device 10 that mates with the under dashboard connector 22*b* of any particular type of the personal vehicle 12.

The on-board computer of the personal vehicle 12 monitors and regulates operation of the engine 20 to one degree or another. Some of the information available to the on-board computer of the personal vehicle 12 or which is provided by the on-board computer may be available on the OBD II. The under dashboard connector 22*b*, therefore, allows the controller 14 to have direct access with any of the data present on the OBD II and also to a limited extent with the on-board computer of the vehicle 12.

The under dashboard connector 22*b* thereby may include information on engine RPM (directly), the gear that the transmission of the engine 20 is in, when a change in gears is occurring (i.e., when the transmission, either manual or automatic is being shifted from one gear to another, either to a higher or lower gear ratio), and the speed of the personal vehicle 12.

This data can be especially useful to optimally enhance the performance of the engine sound replication device 10 and is described in greater detail hereinafter. Of course, the engine sound replication device 10 can utilize any existing or new (i.e., future) connector protocol including wireless, and therefore the under dashboard connector 22*b* is not limited to the OBD II type of connector.

A second alternate source of the engine data 18 for the controller is supplied by direct spark plug connection 22*c* to any one of the spark plugs of the engine 20. In this manner, a positive indication of when the particular spark plug fires (that the spark plug connection 22*c* is directly connected to) is obtained. This can be determined by electrical detection of the voltage spike or by an induction coil that is placed around any of the spark plug wires. Again, knowing the number of cylinders (and the type of engine 20, whether two or four stroke), the RPM of the engine 20 can be calculated.

When direct connection to the spark plug occurs, the output is either connected to the controller 14 by wire or it is transmitted to the controller 14 by any preferred manner (RF, BLUETOOTH™, or other format). A receiver (not shown) is optionally included with the engine sound replication device 10 and which receives information (i.e., data) on the rate of firing of the spark plug (if a hard wire type of connection is not used) and supplies that information in a desired format that is acceptable to the controller 14. The receiver may be included as part of the controller 14 or it may be an accessory device that is purchased as desired and to which the controller 14 is connected.

In a similar manner when direct spark plug connection 22*c* is used to supply the engine data 18, a device (not shown) is provided and is attached inside the engine compartment to one of the spark plugs. This device is expected to be an accessory item that is purchased separately. The direct spark plug connection 22*c* is useful if the personal vehicle 12 does not have a 12 VDC power outlet, or if the periodic electrical spikes 24 are for any reason especially difficult to detect, or if there is no under dashboard connector 22*b* available for use.

A variation of the direct spark plug connection 22*c* is by direct coil attachment. It is possible to determine, again by voltage detection or by induction, when the coil (an inductor) releases stored energy that is used to fire any of the spark plugs.

A third alternate source of the engine data 18 for the controller 14 is supplied by a radio antenna connection 22*d*. A radio antenna of the personal vehicle 12 is identified by the reference numeral 23. The radio antenna connection 22*d* includes an electrical connection to the radio antenna 23. In a manner similar to that as previously described, the electrical waveform present on the radio antenna 23 is supplied through the radio antenna connection 22*d* and is demodulated to obtain the periodic electrical spikes 24, which are then converted into a modified type of intermediate pulse representation signal (similar to the pulse representation signal 26), and which is ultimately converted by the controller 14 into RPM data.

The controller 14 is constantly obtaining and using the engine data 18 signal (i.e., information) supplied to it to determine the RPM of the engine 20. It also compares present RPM with past RPM and based on the rate of change that may be occurring determines if the personal vehicle 12 is accelerating, decelerating, and at what rate it is doing so. It also can determine if the vehicle 12 is being driven at a steady rate of speed.

If the RPM is constant and is at an idle speed, the controller 14 can determine that the personal vehicle 12 is at idle. If the RPM is constant at a speed above idle, the controller 14 can determine that the personal vehicle 12 is driving at a steady speed down the road. If the controller 14 is also receiving data from the on-board computer of the personal vehicle 12 by connection to the under dashboard connector 22*b*, it may be able to tell what gear the transmission of the personal vehicle 12 is in and when a gear change is occurring.

If the controller 14 observes the points of gear change that are occurring it can compare that with engine speed data as well. For example, if the engine speed is accelerating quickly while the gears are changing from a lower gear to a higher gear, the controller can determine that the personal vehicle 12 is accelerating rapidly.

If there is a sudden acceleration accompanied by a drop in gears, the controller 14 can determine that the personal vehicle 12 is being used to pass someone. All of this information affects the engine and exhaust sound that the personal vehicle 12 (or any other vehicle produces) and is useful in optimizing performance of the engine sound replication device 10, as is described in greater detail hereinafter.

The engine sound replication device 10 also includes a library in some form of computer-readable memory, hereinafter referred to as a memory library 30, which includes the engine or exhaust sound of at least one predetermined vehicle (not shown). The predetermined vehicle can include any automobile, truck, boat, airplane, race car, go kart, or other type of a motor vehicle as may be desired.

For the following description, the predetermined vehicle is assumed to be a predetermined automobile (not shown). However, the following description is also generally applicable for use with other types of vehicles that may be used as the predetermined vehicle.

The sound of the engine and/or exhaust of the predetermined automobile are stored as files in the memory library 30. They may be MIDI files or they may be stored or encoded by any desired format. The only requirement is that they be accessible to the controller 14 for use on demand.

Preferably, the files include the recorded sounds of the engine and/or exhaust of the predetermined automobile. In this manner they will accurately represent the sound produced by the predetermined automobile. The files in the memory library 30 can also include sounds of gear changes by the transmission of the predetermined automobile as well as other engine compartment or drive train sounds. While it is preferred that the engine sounds are actually recorded, and therefore highly realistic, it is possible to include synthesized waveform files of the engine and/or exhaust sounds of the predetermined automobile in the memory library 30.

The following description focuses on exhaust sound, although other engine and/or transmission sounds may also be used. The file(s) in the memory library 30 of the predetermined automobile preferably include a recording of the exhaust sound that is produced by the predetermined automobile.

In a basic version of the engine sound replication device 10 it is possible to record the exhaust sound at a single speed. The single speed may be at idle or at some other desired speed of operation of the engine in the predetermined automobile. The controller 14 would then obtain from the memory library 30 and thereafter adjust the single speed exhaust sound of the predetermined automobile based on a software program to reproduce (i.e., to replicate) the sound of the predetermined automobile over a range of engine speeds and to output the replicated exhaust sound as the output signal 16 of the controller 14.

It is especially important to note that the output signal 16 includes a waveform (analog or digital, as preferred) that is representative of the engine sound of the predetermined automobile and that the output signal 16 is always adjusted so that the engine speed of the replicated exhaust sound (i.e., the speed of the engine of the predetermined automobile) is comparable with the speed of the engine 20 of the personal vehicle 12.

Comparable does not mean equal. Different engines turn at different speeds. The maximum safe speed is often referred to as the engine's "red line", a speed not to be exceeded. The red line of the personal vehicle 12 may be more or less than the red line of the engine of the predetermined automobile. One may be at 4,000 RPM whereas the other may be at 8,000 RPM.

For example, assume that the predetermined vehicle includes the exhaust sound of a vintage large displacement eight cylinder car or truck engine that has a red-line of 4,000 RPM. Assume that the personal vehicle 12 has a higher speed small displacement four cylinder engine that includes a red-line of 8,000 RPM.

When the engine sound replication device 10 is properly configured, if the personal vehicle 12 is operating at it's redline (i.e., 8,000 RPM), the output signal 16 will include the exhaust sound of the predetermined automobile when the predetermined automobile's engine is turning at 4,000 RPM.

This is accomplished by the controller obtaining from the memory library 30 a file of the predetermined automobile engine's exhaust sound recorded at its red line or, alternately, recorded at the highest available rate (RPM). If the highest recorded rate is less than the red line of the engine of the predetermined automobile, the controller 14 compresses the highest available rate (RPM) recorded file which, in turn, shortens the apparent time between spark plug firings of the engine of the predetermined automobile so as to replicate the predetermined automobile engine operating at its red line (i.e., 4000 RPM).

If the personal vehicle 12 is operating at 4,000 RPM (midrange), the output signal 16 will include the exhaust sound of the predetermined vehicle when the predetermined vehicle's engine is turning at approximately 2,000 RPM (i.e., at or about its midrange). To accomplish this, the controller 14 obtains from the memory library 30 a recorded file of the exhaust sound of the predetermined automobile operating at 2000 RPM or the file that is closest to 2000 RPM and adjusts it (either increases or decreases the apparent speed of the engine of the predetermined automobile) so that it is equal to 2000 RPM.

It is important to note that the recorded files of exhaust sound in the memory library 30 are of relatively short duration. These files are merely repeated (i.e., sampled and obtained again and again from the memory library 30) so as to provide the controller 14 with a continuous stream of engine sounds (exhaust or other) from the memory library 30 that correspond always with the current state of the engine 20 in the personal vehicle 12.

In this manner, the output signal 16 is continuous whenever the engine 20 is running. The output signal 16 is made up of back to back segments (i.e., files) of the recorded sounds stored in the memory library 30. These segments vary depending on changes in real time that occur with the personal vehicle 12.

Similarly, the typical exhaust sound at idle speed (or the closest file thereto) of the engine of the predetermined automobile that is stored in the memory library 30 will be used as the output signal 16 when the engine 20 of the personal vehicle 12 is at idle speed.

If the predetermined automobile had a higher red-line than that of the personal vehicle 12, the output signal 16 will be proportionally correlated in a similar manner except that the RPM value of the output signal 16 will be at a proportionally higher RPM than that which the engine 20 of the personal vehicle 12 is revolving.

In this manner, the engine sound replication device 10 is able to provide the output signal 16 that is proportionally correlated with the speed of the engine 20 of the personal vehicle 12 as compared with an equivalent engine speed of the predetermined vehicle. As the output signal 16 represents the exhaust (and/or engine) sound of the predetermined vehicle, the engine sound replication device 10 is able to replicate the exhaust (and/or engine) sound of the predetermined vehicle and to overlay the replicated sound with the normal ambient sounds of the personal vehicle 12. This is described in greater detail hereinafter.

For the moment, it is important to note that the correlation provided by the engine sound replication device 10 provides for a realistic sound. By way of contrast, if the personal vehicle 12 was traveling at a low, steady speed and an exhaust sound of an accelerating predetermined automobile was instead incorrectly superimposed, the resultant combined sound would be unrealistic and, therefore, undesirable.

If desired, the controller 14 may include another user-selectable input that is for the make and model input 32 of the personal vehicle 12. The make and model input 32 is used to inform the controller 14 as to the make and model the personal vehicle 12. This information is stored in memory as make and model files (RAM, ROM, external memory, or additional files stored in the memory library 30) and is accessible to the controller 14. The make and model files are used to inform the controller as to what is the maximum RPM (i.e., the red line) of the personal vehicle 12. The make and model files also preferably include red line information about the predetermined vehicle. The controller 14 is then able to proportionally correlate the two red-line values, thereby automatically and optimally matching the respective engine speeds between the predetermined vehicle and the personal vehicle.

If a particular version of the engine sound replication device 10 includes the make and model input 32 capability, it may not be necessary to use, or in some instances to even include, the cylinder input switch 28. This is because the make and model input 32 informs the controller 14 as to what type of personal vehicle 12 the engine sound replication device 10 is being used in, and the information about the personal vehicle 12 that is stored in memory (RAM, ROM, external memory, or memory library 30) will preferably include information on the number of cylinders in the engine 20 of the personal vehicle 12.

It is preferable that the memory library 30 include recorded exhaust sounds of the predetermined automobile at different speeds and during different conditions. For example, the exhaust sound of the predetermined automobile is preferably recorded at idle, mid-range, and at high RPM, during acceleration and deceleration. It is also preferable to record the exhaust sound of the predetermined automobile during heavy acceleration and heavy deceleration. Other engine sounds (like engine compartment noise and gear change noise) are also included in the memory library 30, as desired.

In this manner, the controller 14 is able to use whichever variant of the exhaust (and/or engine) sound of the predetermined automobile that most closely corresponds to the manner in which the personal vehicle 12 is being operated at that moment. Whichever variant of the predetermined automobile's exhaust (and/or engine) sound is used by the controller 14, that signal is adjusted for the RPM of the personal vehicle 12 and is outputted accordingly, as the output signal 16. This greatly improves realism of the replicated exhaust sound. It is to be understood that the output signal 16 is the replicated sound of the predetermined automobile, adjusted to match the speed and condition of operation of the personal vehicle 12 at any given moment in time.

The output signal 16 may also include a combined sound that is derived by two or more files stored in the memory library 30, and which are both supplied simultaneously (or nearly so) to the controller 14. An example would be if the controller 14 is aware that the personal vehicle 12 is operating at, say a midrange RPM, and is experiencing a gear change from a lower to a higher gear. If available, the controller would simultaneously obtain and use a file from the memory library of the engine of the predetermined vehicle (automobile) operating at its midrange RPM and also of the recorded sound produced by the predetermined vehicle when it is experiencing a gear change from a lower gear to a higher gear.

In this manner, a highly realistic composite sound waveform is provided as the output signal 16. The audible result is that, to the driver of the personal vehicle 12, it appears as though the sound of the predetermined vehicle's transmission as it increases gears, matches perfectly with the gear change of the personal vehicle 12 and that the predetermined automobile's engine sounds (i.e., exhaust or other engine sounds) also match perfectly with the operation of the personal vehicle 12.

This results in the output signal 16 being seamless (i.e., no breaks) and especially realistic. As soon as the controller 14 determines that the personal vehicle 12 has completed its gear change, then the file of recorded sound produced by the predetermined vehicle when it is experiencing a gear change is no longer used by the controller 14. However, the file closest to the speed of the predetermined automobile that is desired (which may be faster or slower than the engine 20 of the personal vehicle is turning) is again obtained from the memory library 30 and is used. If desired, any of the files obtained from the memory library can be stored in any form (i.e., as intermediate files) in a memory cache (RAM) that may be provided on the controller 14 to permit faster access. If desired, all of the files appertaining to the selected type of the predetermined vehicle may be stored in the cache during operation of the engine sound replication device 10.

It is important to note that the controller 14 can utilize as many files from the memory library 30 (or stored in cache) as may be desired simultaneously. It has previously been described how a gear change file of the predetermined automobile can be used simultaneously with a recorded file of the engine speed of the predetermined automobile to create a composite sound waveform as the output signal. Files of the predetermined vehicle during acceleration, deceleration, engine compartment noise, cockpit noise, drive train noise, and others may be combined in any desired way to further enhance the composite sound waveform, and thereby improve realism of the replicated sound. If the predetermined vehicle is an airplane, one of the files in the memory library 30 could be, if desired, the sound of the propeller turning.

As mentioned above, it is also preferable that the memory library 30 include the recorded exhaust sounds of a plurality of the predetermined vehicles or automobiles, and it is further preferred that the plurality of different types of the predetermined vehicles or automobiles include additional exhaust and/or engine sound recordings taken at different engine speeds and during different operating conditions for the different predetermined automobiles.

By having a plurality of recorded exhaust and/or engine sounds for a plurality of different types of the predetermined automobile stored in the memory library 30, the engine sound replication device 10 provides for an unexpected and valuable benefit that is vastly different than could occur with any factory exhaust system or after-market exhaust system.

The driver of the personal vehicle 12 is able to vary another user-selectable input and to make a selection of the type of the predetermined vehicle 34 that is to be replicated from those available in the memory library 30. In this manner, any of the plurality of recorded exhaust and/or engine sounds from which of the plurality of different types of the predetermined automobiles is obtained after selection and is used by the controller 14 as previously described, and outputted as the output signal 16.

In this manner, by the flick of a switch or by selection from a menu of possible choices appearing on the display of the controller 14, the driver can instantly change the output signal 16 from one type of replicated vehicle to another type. In one moment, the personal vehicle 12 can be made to sound like a vintage muscle car. By selection, the next moment it can sound like a truck or like a high-performance racing automobile.

Once the engine sound replication device 10 has been installed in the personal vehicle 12, the driver (i.e., user) can instantly select from any of the various exhaust sounds of the various different types of the predetermined automobiles that are stored in the memory library 30. No additional modification is required to change the way the personal vehicle 12 sounds.

It is, of course, possible to include as many of the different recorded exhaust and/or engine sounds in the memory library 30 as is desired. It is also possible to sell or otherwise provide additional memory (30*a*, dashed lines) of other or exotic sounding exhaust sounds either in the form of attachable memory cards (i.e. ROM chips) or to download (such as from the Internet) additional exhaust and/or engine sounds. In this manner, the customizing of exhaust and/or engine sound that is produced by the engine sound replication device 10 is possible, possibly at extra cost. Certain people who would like to have their personal vehicle 12 sound different or special are likely to pay a premium to replicate unique or exotic exhaust sound patterns.

If desired, the engine sound replication device 10 includes a volume control 36. The volume control 36 is used to vary and thereby to control the amplitude of the output signal 16. In this manner the volume of the replicated exhaust sound can be controlled.

For example, if the driver of the personal vehicle 12 is not on a public road and wishes to increase the volume of the replicated exhaust sound so that it exceeds legal street limits, the driver merely raises the volume control 36 when desired. Prior to again entering a public road, the driver would first lower the volume control 36 so that the volume of the replicated exhaust is within permissible levels.

The output signal 16 can be used in various ways to audibly produce the replicated exhaust sound, a few of which are discussed herein.

The output signal 16 can be wired directly 16*a* to a stereo system in the personal vehicle 12. In this case the volume on the stereo can be used to control the volume of the replicated exhaust sound that is emitted by stereo speakers 38. The stereo speakers 38 are disposed in an interior (i.e., in the cockpit) of the personal vehicle 12.

Alternately, the output signal 16 can be transmitted 16*b* to the stereo system by RF (such as on an FM frequency) or BLUETOOTH™ or by any other desired method. In this case, the engine sound replication device 10 would include an RF (FM) or BLUETOOTH™ or other type of transmitter that continually transmits the output signal 16.

If the vehicle's stereo system is tuned to the appropriate RF (i.e., FM) frequency, and if the output signal 16 is being transmitted via FM, the transmitted signal will be absorbed by the radio antenna 23. The stereo system will receive the FM form of the output signal 16 from the radio antenna 23 which will be a modulated signal along with the carrier frequency. In normal fashion, the stereo will strip off the audio portion of the RF (or BLUETOOTH™ or other received signal) and output the audio portion to the stereo speakers 38.

The advantage of RF (FM), BLUETOOTH™, or other transmission of the output signal 16 to the stereo is that minimal wiring is required. For many applications, the engine sound replication device 10 need only be plugged into the 12 VDC power outlet 22*a*. No other electrical connections are required. The stereo will then output the replicated exhaust sound to the stereo speakers 38. The driver is able to use the stereo for its normal purposes such as listening to FM, AM, satellite (if so equipped), cassette when desired and can, instead, use the stereo to produce the replicated exhaust sounds when desired by tuning it to the appropriate FM or BLUETOOTH™ input source.

The stereo speakers 38 being in the interior of the personal vehicle 12 permit listening to the replicated exhaust without substantially affecting others, such as pedestrians. Instead, the driver and occupants of the personal vehicle 12 are able to customize and tailor the engine sounds that they hear so as to make the personal vehicle 12 appear to sound as any other type of the predetermined automobile.

However, it is also expected that for many users of the engine sound replication device 10, it will maximize their enjoyment of the engine sound replication device 10 if the exhaust sounds that others (i.e., pedestrians, those in other vehicles) hear was that which is produced by the engine sound replication device 10 and not that which is normally produced by the personal vehicle 12.

To accomplish this, an auxiliary audio amplifier 40 may be includes as a part (or as an option) of the engine sound replication device 10. The auxiliary audio amplifier 40 is either connected by wire to the output signal 16 or it can include a separate amplifier receiver that receives and utilizes the audio content of the output signal 16 if the output signal is transmitted (via RF, BLUETOOTH™, or other). The auxiliary audio amplifier 40 includes a speaker output that is connected to at least one auxiliary speaker 42. The auxiliary speaker 42 may be in an interior of the personal vehicle 12 or, preferably, it is of weatherproof design and is located at an exterior location, attached to the personal vehicle 12.

A preferred shape for the auxiliary speaker 42 is to include a cylindrical or conical shape that replicates the shape of most common types of exhaust tailpipes. A preferred location for placement of the auxiliary speaker 42 is to the rear of the personal vehicle 12 at a lower location proximate where the actual exhaust system (i.e., the exhaust tailpipe) of the engine 20 is/are disposed.

If the personal vehicle 12 includes a dual exhaust system, it is desirable to include two of the conical shaped auxiliary speakers 42, each one disposed adjacent to one of the tailpipes. This position provides especially realistic sound distribution to those outside of the vehicle. It can also significantly enhance the appearance of the vehicle.

For example, if the personal vehicle 12 includes only one exhaust pipe (i.e., if it is a single-exhaust vehicle), the use of two of the conical shaped auxiliary speakers 42 that are both disposed in a spaced-apart relationship with respect to each other at a lower elevation and to the rear of the personal vehicle 12 can create the illusory appearance that the personal vehicle 12 has a dual exhaust system. The appearance is further reinforced by the sound that emanates from the two conical shaped auxiliary speakers 42 when the vehicle 12 is running and the engine sound replication device 10 is activated (i.e., turned on).

If desired, the auxiliary speaker 42 may include a fairly limited frequency response range because the exhaust sounds that are being replicated may be narrow and in some instances may predominantly include base frequencies. In a similar manner, the auxiliary amplifier 40 may include any desired frequency range and/or power output capability.

Another user-selectable input that can be included is for an internal or external speaker selection switch 44. The internal or external speaker selection switch 44 preferably includes three positions. A first position is for activation of the interior stereo speakers 38 only. A second position is for activation of the exterior auxiliary speaker 42 only. A third position is for activation of both the interior stereo speakers 38 and also the exterior auxiliary speaker 42.

It is also possible to directly connect by wire an output of the stereo of the personal vehicle 12 in certain situations to the auxiliary speaker 42, thereby eliminating the need for the auxiliary amplifier 40. It is desirable to include an additional driver-selectable switch that can turn on or off the auxiliary speaker 42 if the stereo does not already include one.

It is also important to note that the output signal 16 can go to a single speaker (i.e., to only one of the stereo speakers 38 or to only one of the auxiliary speakers 42). In this mode, the output signal 16 is monophonic. Alternately, the output signal 16 can be used to drive (either directly if the controller 14 has an amplifier included as a part thereof) or the stereo system or auxiliary amplifier 40 can be used to drive a pair of speakers to produce stereophonic replication of the exhaust and/or engine sounds of the predetermined vehicle. If desired, the memory library 30 can include a monophonic or stereophonic recording of the exhaust and/or engine sounds of the predetermined vehicle (or vehicles).

If desired, the recorded exhaust and/or engine sounds in the memory library 30 can also include sounds that are emanating from or in the engine compartment of the predetermined automobile or even those sounds which can be heard in the cockpit (i.e., interior) of the predetermined automobile. In this manner the replicated exhaust sounds of the predetermined vehicle that are replicated in the personal vehicle 12 and which are heard through the stereo speakers 38 or through the auxiliary speaker 42 (or pair of auxiliary speakers 42) can be made even more realistic and representative of the actual sounds that are heard in the predetermined vehicle.

The engine sound replication device 10 can provide the driver with a realistic simulated experience of driving the predetermined vehicle. In this way, the driver can experience, to a limited degree, what it feels like to drive a vintage automobile or a high-performance race car or a powerful (high horsepower) muscle car. The sound that these vehicles produce is an important aspect that contributes to the “feel” of driving them.

Furthermore, the driver can experience this for different types of the predetermined vehicle merely by making a switch (or menu) selection and thereby replicating the sound of a different one of the predetermined vehicle engine and/or exhaust sounds that are stored in the memory library 30.

In this manner, an ordinary type of the personal vehicle 12 can be made to sound like any other type of a vehicle (i.e., any type of the predetermined vehicle). If the personal vehicle 12 is a common type of a car, it can be made to sound like any other type of automobile, racecar, truck, motorcycle, or even like an airplane or boat.

In summary, the output signal 16 includes a preferred form of the replicated sound of the preferred predetermined vehicle and that sound is heard by the driver and occupants of the personal vehicle by audio output of the output signal 16 through the stereo speakers 38 or the auxiliary speaker(s) 42, or both. If desired, two of the auxiliary speakers 42 are used to replicate a dual-exhaust system. In the drawing (FIG. 2) the second auxiliary speaker 42 is disposed behind the one shown and is therefore not visible.

Figure 4:
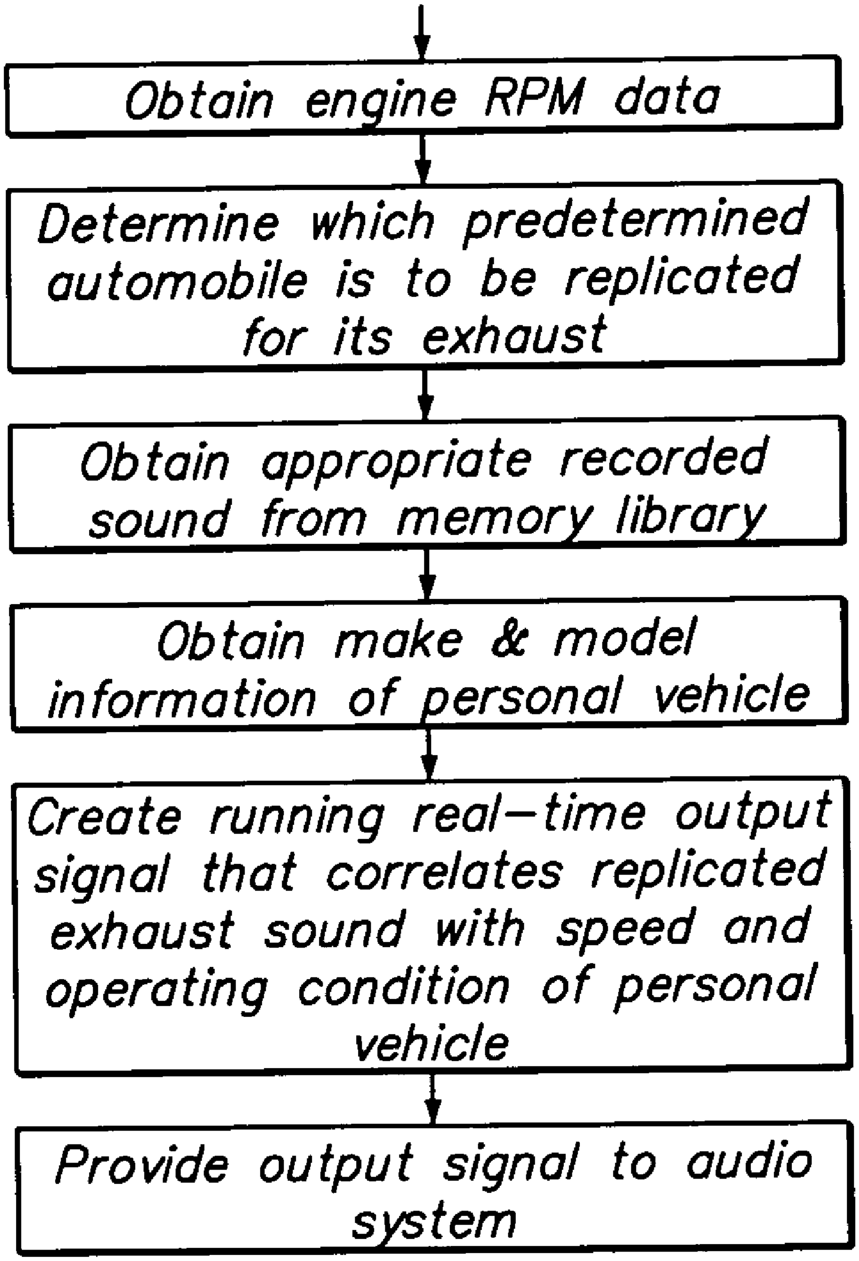
FIG. 4 is a high-level flowchart of the software for a controller of the engine sound replication device of FIG. 1.

Referring now to FIG. 4 is shown a high-level flowchart that describes basic operation and one possible configuration of the software for the microcomputer that is used to control operation of the engine sound replication device 10.

The engine sound replication device 10 also provides a further unexpected benefit in that the controller 14 is continually obtaining information on the state of the engine 20 of the personal vehicle 12 and that information can be used to provide a diagnostic benefit.

When engine data 22 is obtained from the 12 VDC power outlet 22*a* or by direct spark plug connection 22*c* to any one of the spark plugs (or coil) of the engine 20 or to the radio antenna 23, the controller is able to determine and, as desired, analyze the electrical spikes 24 that are obtained. In this way, the quality of the firing of the spark plugs can be observed. This is an essential parameter that contributes to optimum performance of the engine 20. The manner by which the waveform of the electrical spikes 24 affects the capabilities of the engine 20 can be compared to the way that the waveform of an electrocardiogram reveals the performance capabilities of a human heart.

The engine sound replication device 10 can include a diagnostic mode that can either be set by user-selectable input or, if desired, can always operate in a background mode and, when a potential problem is detected, alert the driver by any preferred type of warning, such as by the presentation of engine performance data on the display screen of the engine sound replication device 10, an audible and/or visual warning light, etc. The ability of the engine sound replication device 10 to diagnose performance of the engine 20 can occur at idle, at speed, and under acceleration or deceleration, thereby providing useful diagnostic information.

When engine data 22 is obtained from the under dashboard connector 22*b* (i.e., the OBD II type of connector) the engine sound replication device 10 can utilize all available parameters of engine data in a manner similar to that which currently available automotive diagnostic tools that rely upon connection to the OBD II connector presently diagnose engine condition, including obtaining any “engine codes” that may be stored in the on-board computer of the personal vehicle 12 or in any storage media (i.e. RAM) associated with the on-board computer. The engine sound replication device

10*c* can even be configured to clear the "engine codes", as desired and to analyze any of the engine data that is available on the OBD II connector (or other type of connector) and to present the results of analysis and data obtained to the driver for viewing, for example, on the display screen of the engine sound replication device 10, if so equipped.

In this manner, a preferred higher-end version of the engine sound replication device 10 can also be used to perform diagnostic procedures on the state of the engine 20 of the personal vehicle 12 or, if desired, to any other personal type of vehicle (not shown) to which it is temporarily connected. This capability is useful and is expected to appeal to professional and home mechanics, alike.

Figure 5:
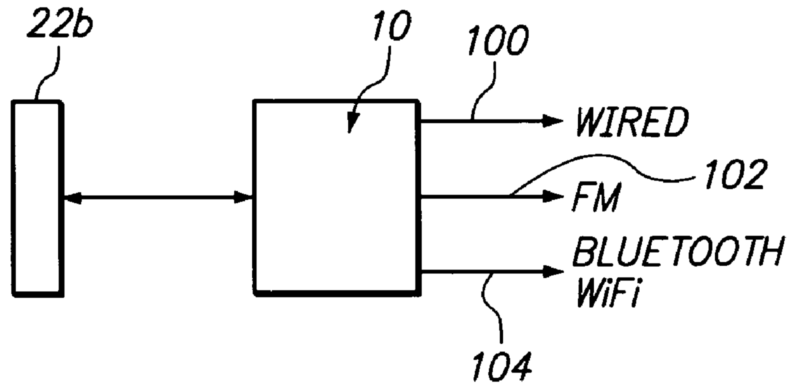
FIG. 5 is a block diagram of the engine sound replication device of FIG. 1 connected to an OBD II connector.

Referring now to FIG. 5 is shown a block diagram of the engine sound replication device 10 connected to the OBD II under dash connector 22*b*. This drawing shows the basic ways of configuring the engine sound replication device 10 not anticipated by the prior art. The output signal 16 (of FIG. 1) as shown includes a wired 100 output that is wired to either the stereo system in the personal vehicle 12 or to the auxiliary audio amplifier 40. The stereo system outputs a signal to drive the speakers of the personal vehicle 12 that the stereo is connected to for real time playback of the replicated engine sound. The auxiliary audio amplifier 40 similarly drives auxiliary speakers 42 that are located either in the personal vehicle 12 or external to it. If the auxiliary speakers 42 are external, preferably they are mounted proximate the exhaust tailpipe(s), as previously described.

Alternately, the output signal 16 includes an FM wireless output 102. The FM wireless output 102 transmits the output signal 16 as an FM radio frequency that the stereo system in the personal vehicle 12 is tuned to and able to receive.

A third basic configuration includes a BLUETOOTH™ output 104 that transmits the output signal 16 using BLUETOOTH™ technology and protocol. Certain of the newer versions of the stereo system in the personal vehicle 12 are able to receive this signal and, as described above, drive the personal vehicle's 12 stereo speakers to produce the replicated engine sound. It is also possible for auxiliary audio amplifier 40 to receive the BLUETOOTH™ signal and drive the auxiliary speakers 42.

If desired, a different wireless protocol such as that of 802.11 and often referred to as "WiFi" can be used instead of or in addition to the BLUETOOTH™ protocol. The 802.11 communication standard reflects an industry communication standard and is commonly used for wireless communication with laptop computers, for example. To simplify remaining discussion, it is to be understood that whenever BLUETOOTH™ is mentioned herein, that 802.11 (WiFi) or any other desired, similar or different wireless protocol can be used, either alone or in combination with any other wireless protocol standard.

Figure 6:
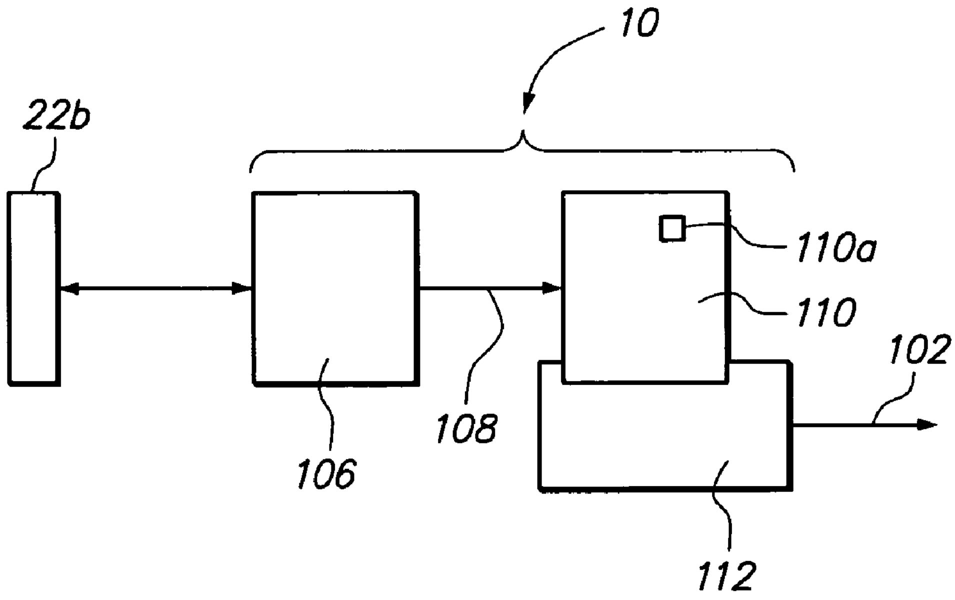
FIG. 6 is a block diagram of an OBD II transmitter connected to an OBD II connector of the personal vehicle and a consumer product that is used as a platform for the engine sound replication device.

Referring now to FIG. 6 is shown a block diagram of the engine sound replication device 10 configured to obtain the engine data of the personal vehicle 12 from the under the dash OBD II connector 22*b* using a commercially available first device to extract the desired engine data from the OBD II connector and another commercially available second device to act as a "platform" to implement the functionality of the controller 14, memory library 32, and other component parts of the engine sound replication device 10.

The first device includes an OBD II transmitter 106 that obtains the OBD II data and transmits it using BLUETOOTH™ technology and protocol as a wireless BLUETOOTH™ OBD II data transmission signal 108. The OBD II transmitter 106 is a commercially available product that is commonly referred to as a "mechanics wireless relay". The mechanics wireless relay is commonly used by mechanics to connect to the OBD II connector 22*b* and to transmit OBD II engine data using BLUETOOTH™ technology and protocol to an engine analyzer to assist in the diagnosis and servicing of engines. The mechanics wireless relay may be usable as it is or, if desired, it can be modified to more favorably transmit only the desired data from the OBD II connector 22*b* and provide the OBD II transmitter 106.

The advantage of the OBD II transmitter 106 is that a simple plugging in of the OBD II transmitter 106 into the OBD II connector 22*b* provides the desired data from the engine of the personal vehicle 12 without the need for any wiring. This saves time and simplifies the installation process.

The second device includes a commercially available platform 110. The platform 110 is a device that includes a microprocessor and sufficient ram and non-volatile memory to implement the functionality of the engine sound replication device 10. Ideally, software can be loaded into the platform 110 so that it is able to function as the engine sound replication device 10.

This can potentially lower the cost of the engine sound replication device 10 by a significant degree for those consumers who already own the platform 110. For a modest investment they can obtain the OBD II transmitter 106 and download the software for the platform 110. Using the stereo in the personal vehicle 12 a very low cost way to enjoy the engine sound replication device 10 is provided. Additionally, most consumers can install and use this configuration of the engine sound replication device 10 without the need for outside technical assistance, thereby saving even more. If outside help is required, the time and therefore the cost should be minimal.

A preferred consumer device for use as the platform 110 includes either the IPHONE™ or the IPOD TOUCH™ that are manufactured by APPLE™ computers. Assuming that the IPHONE™ is used as the platform 110, a cradle 112 is also purchased by the user. The cradle 112 is a commercially available product that plugs into the 12 VDC power outlet of the personal vehicle 12 for electrical power. The cradle 112 connects electrically with the IPHONE™ and maintains its electrical charge during use. The cradle 112 also includes the ability to output an audio output signal from the IPHONE™ by wireless FM broadcast.

The user who owns the IPHONE™ is likely to already have the cradle 112 because the IPHONE™ can be used to store music files (i.e., songs) for playback. The cradle 112 is used to output the songs being played by the IPHONE ™ via the FM wireless output 102 (i.e., by way of FM broadcast) for reception by the stereo system of the personal vehicle 12 and for playback through the personal vehicle's speakers. This allows the user to listen to songs from the IPHONE™ while driving.

When the IPHONE™ has been downloaded with the necessary software to replicate the functionality of the engine sound replication device 10 it is placed in the cradle 112. The IPHONE™ is enabled to run the software and replicate the engine sound replication device 10. The stereo is tuned to receive an FM signal on the same FM frequency that the cradle 112 transmits the output signal 16 (of the IPHONE™) on.

The OBD II transmitter 106 is installed into the OBD II connector 22*b*. When the engine 20 of the personal vehicle 12 is started, the engine data is broadcast using BLUETOOTH™ technology and protocol and received by the IPHONE™. The IPHONE™, functioning as the engine sound replication device 10, combines the engine sounds of the predetermined vehicle (i.e., whatever type of engine sound is to be replicated) from memory library 30, processes the engine sounds of the predetermined vehicle to match the RPM and the actual acceleration or deceleration of the engine 20 of the personal vehicle 12 (using the OBD II data) and outputs the output signal 16 to the cradle 112. The cradle 112 broadcasts the output signal 16 via FM and the stereo captures it and plays the replicated engine sound over the stereo. The user adjusts the volume on the stereo to suit.

When the engine 20 is turned off the OBD II transmitter 106 stops transmitting data and the stereo becomes silent (assuming the stereo still has power).

The platform 110 (IPHONE™) can be downloaded with the software by a USB computer connection. APPLE™ could, if desired, provide this service for a fee. Similarly, the various engine sounds in the memory library 30 can be updated or exotic sounds added, again preferably for a fee. Alternately, a detachable memory card can be inserted in or removed from the platform 110 for software or memory library 30 storage and updates.

Information and specifications regarding the OBD II connector can be found on the Internet and is provided by the "Society of Automotive Engineers".

It is also noted that the IPHONE™ includes an accelerometer 110*a* therein. As desired, the software of platform 110 can be modified to also use an output of the accelerometer 110*a* or any remote accelerometer (not shown) that the platform 110 or any other embodiment of the engine sound replication device 10 may be connected to also obtain data regarding acceleration and deceleration of the personal vehicle 12 in which the platform 110 is disposed.

The acceleration or deceleration data supplied to the platform 110 is used by the controller 14 to vary or alter the output signal 16 so that the output signal 16 better correlates to the present state of operation of the engine of the personal vehicle 12. The resultant output signal 16 will better correlate with the state of the engine of the personal vehicle 12. Therefore, the replicated engine sound that is being produced will seem much more realistic because it will better correlate (i.e., by altering the output signal 16) with the actual state of the engine of the personal vehicle 12.

In addition to acceleration or deceleration data, the controller 14 (for all embodiments) is preferably supplied with additional operating parameters or states regarding the engine of the personal vehicle. Some of the desired parameters or states can be obtained directly off the pins of the OBD Ii connector, while others can be determined or approximated by extrapolation and comparison of data available from the OBD II connector.

If desired, other transducers useful in monitoring (i.e., detecting) any desired parameter or state of the engine of the personal vehicle 12 can be optionally included and connected to the engine sound replication device 10 for use by the controller 14. For example, information about the RPM, load, transmission gear ratio, when changing from one transmission gear ratio to another transmission gear ratio for either manual or automatic transmissions and whether increasing or decreasing in overall gear ratio, acceleration, deceleration, and vacuum are all potentially desirable parameters or states of the engine of the personal vehicle 12 to monitor and to communicate in real time (i.e., as close as possible to real time) to the controller 14.

The use of any and all desired parameter or state data that is timely supplied to the controller 14 is used by the controller 14 to modify, vary, and adjust the output signal 16 so that it better correlates with the actual state or operating condition of the engine 20 of the personal vehicle 12 at any given time, thereby improving both realism and enjoyment of the experience.

The invention has been shown, described, and illustrated in substantial detail with reference to the presently preferred embodiment. It will be understood by those skilled in this art that other and further changes and modifications may be made without departing from the spirit and scope of the invention which is defined by the claims appended hereto.

What is claimed is:

1. An engine sound replication device, comprising:

(a) a file containing a sound from an engine of a predetermined vehicle that is readable by a computer, and wherein said file containing a sound from an engine of a predetermined vehicle is stored in a memory library;

(b) means for determining information regarding at least some aspect of a present state of an engine of a personal vehicle wherein said means for determining includes an electrical connection to an OBD II type of connector and the extraction of data regarding said present state of said engine of said personal vehicle from said OBD II type of connector wherein said present state includes data regarding the number of revolutions per minute that said engine of said personal vehicle is operating at or data as to which gear a transmission of said personal vehicle is disposed in, and wherein said extraction of data regarding said present state of said engine of said personal vehicle occurs continuously through said OBD II type of connector whenever said engine sound replication device is operating;

(c) modifying said file of an engine sound to correspond in a desired way with said present state of said engine of said personal vehicle to correspond with said data regarding the number of revolutions per minute that said engine of said personal vehicle is operating at or to correspond with said data as to which gear said transmission of said personal vehicle is disposed in; and (d) an output signal, said output signal including a replication of said engine sound of said predetermined vehicle, wherein said output signal includes an amplifier, and wherein said engine sound replication device includes a controller, and wherein said controller includes a microcomputer, and wherein a content of said memory library is accessible to said controller, and wherein said means for determining information regarding at least some aspect of a present state of an engine includes a current load of said engine of said personal vehicle, and wherein said content of said memory is selected depending on said load of said engine of said personal vehicle, and wherein said controller is able to adjust said content of said memory library to provide an adjusted output signal that optimally correlates with said load of said engine of said personal vehicle, and wherein said output signal includes said adjusted output signal.

2. The engine sound replication device of claim 1 wherein said file containing a sound from an engine of said predetermined vehicle includes a plurality of files containing a plurality of sounds of said engine of said predetermined vehicle.

3. The engine sound replication device of claim 1 wherein said file containing a sound from an engine of said predetermined vehicle includes an exhaust sound.

4. The engine sound replication device of claim 1 wherein said file containing a sound from an engine of said predetermined vehicle includes an engine compartment sound.

5. The engine sound replication device of claim 1 wherein said file containing a sound from an engine of said predetermined vehicle includes a gear change by a transmission of said predetermined vehicle.

6. The engine sound replication device of claim 1 wherein said file containing a sound from an engine of said predetermined vehicle includes drive train sound of said predetermined vehicle.

7. The engine sound replication device of claim 1 wherein said output signal is continuously provided whenever said engine of said personal vehicle is operating.

8. The engine sound replication device of claim 1 including means for providing said output signal as an input signal to said amplifier, stereo system, or speaker for playback as an audio replication of said engine sound of said predetermined vehicle.

9. The engine sound replication device of claim 8 wherein said output signal includes electrical connection through a wire.

10. The engine sound replication device of claim 8 wherein said output signal includes means for transmitting said output signal to a receiver.

11. The engine sound replication device of claim 10 wherein said receiver includes a stereo receiver.

12. The engine sound replication device of claim 10 wherein said receiver is electrically connected to an auxiliary amplifier.

13. The engine sound replication device of claim 8 wherein said speaker is disposed in an interior of said personal vehicle.

14. The engine sound replication device of claim 8 wherein said speaker is disposed at an exterior of said personal vehicle.

15. The engine sound replication device of claim 14 wherein said speaker is disposed under a rear of said personal vehicle.

16. The engine sound replication device of claim 15 wherein said speaker includes a generally cylindrical or conical shape that resembles at least a portion of a tailpipe in appearance.

17. The engine sound replication device of claim 1 wherein said file containing a sound from an engine of said predetermined vehicle includes a sound from an engine selected from the group consisting of an automobile, motorcycle, truck, boat, airplane, racecar, and go-kart.

18. The engine sound replication device of claim 1 wherein said means for determining information regarding at least some aspect of a present state of said engine of said personal vehicle includes a current RPM of said engine of said personal vehicle, and wherein said content of said memory is selected depending on said RPM of said engine of said personal vehicle, and wherein said controller is able to adjust said content of said memory library to provide said adjusted output signal that optimally correlates with said RPM of said engine of said personal vehicle, and wherein said output signal includes said adjusted output signal.

19. The engine sound replication device of claim 18 wherein said memory library includes a plurality of files, each of said plurality of files containing said sound from said engine of said predetermined vehicle, and wherein any of said plurality of files is selected from the group consisting of an engine compartment sound, a transmission sound, a gear change sound, an exhaust sound, and a cockpit sound of said predetermined vehicle.

20. The engine sound replication device of claim 19 wherein said controller is able to simultaneously select and combine any of said plurality of files to produce a composite sound waveform as said output signal.

21. The engine sound replication device of claim 1 wherein said file containing said sound from said engine of said predetermined vehicle includes a recording of said sound.

22. The engine sound replication device of claim 1 wherein said file containing said sound from said engine of said predetermined vehicle includes a synthesized representation of said sound.

23. The engine sound replication device of claim 1 wherein said means for determining information regarding at least some aspect of a present state of said engine of said personal vehicle includes generating a diagnosis of said present state of said engine of said personal vehicle, and includes an indication of said diagnosis of said present state of said engine of said personal vehicle.

24. The engine sound replication device of claim 1 wherein said means for determining information regarding at least some aspect of a present state of said engine of said personal vehicle includes an OBD II wireless transmitter that is connected to said OBD II connector, and wherein said OBD II wireless transmitter provides a wireless OBD II data transmission signal of said present state of said engine of said personal vehicle when said engine of said personal vehicle is running, and wherein said wireless OBD II data transmission signal includes a wireless signal that is compatible with BLUETOOTH™ protocol.

25. The engine sound replication device of claim 24 including a commercially available device as an operating platform, and wherein said platform includes software and circuitry sufficient to emulate or otherwise replicate the functionality of said engine sound replication device, and wherein said platform is able to receive said wireless OBD II data transmission signal and wherein said modifying said file of said engine sound to correspond in a desired way with said present state of said engine of said personal vehicle includes said platform altering a state of said engine sound to correspond with said present state of said engine of said personal vehicle that is obtained from said wireless OBD II data transmission signal to produce said output signal.

26. The engine sound replication device of claim 25 wherein said platform includes an IPHONE™ or an IPOD TOUCH™.

27. The engine sound replication device of claim 25 including a cradle, and wherein said platform is adapted to connect to said cradle and wherein said cradle is adapted to receive said output signal from said platform, and wherein said cradle includes a transmitter for transmitting said output signal via an FM broadcast.

28. The engine sound replication device of claim 1 wherein said means for determining information regarding at least some aspect of a present state of said engine of said personal vehicle includes selection of at least one operating parameter or state of said engine of said personal vehicle from the group consisting of RPM, load, transmission gear ratio, changing from one transmission gear ratio to another transmission gear ratio, acceleration, deceleration, and vacuum, and wherein said content of said memory is selected depending on said at least one operating parameter or state of said engine of said personal vehicle, and wherein said controller is able to adjust said content of said memory library to provide said adjusted output signal that optimally correlates with said at least one operating parameter or state of said engine of said personal vehicle, and wherein said output signal includes said adjusted output signal.

29. The engine sound replication device of claim 1 wherein said file containing said sound from said engine of said predetermined vehicle is selected from said memory library by said controller, and wherein said means for determining information regarding at least some aspect of a present state of said engine of said personal vehicle includes selection of at least one operating parameter or state of said engine of said personal vehicle from the group consisting of RPM, load, transmission gear ratio, changing from one transmission gear ratio to another transmission gear ratio, acceleration, deceleration, and vacuum, and wherein said file containing said sound from said engine of said predetermined vehicle is varied by said controller in response to said controller having access to and obtaining said at least one operating parameter or state of said engine of said personal vehicle, sufficient to produce an adjusted file of said sound from said engine of said predetermined vehicle, and to provide said adjusted file of said sound from said engine of said predetermined vehicle as said output signal, and wherein said output signal correlates with said at least one operating parameter or state of said engine of said personal vehicle, and wherein a greater sense of realism is provided by said adjusted file of said sound from said engine of said predetermined vehicle than by said file containing said sound from said engine of said predetermined vehicle.

* * * * *